US012787537B2

(12) United States Patent
Luo

(10) Patent No.: US 12,787,537 B2
(45) Date of Patent: Nov. 3, 2026

(54) PREPARATION METHOD FOR QLED DEVICE, DISPLAY SUBSTRATE, AND DISPLAY APPARATUS

(71) Applicant: TCL TECHNOLOGY GROUP CORPORATION, Huizhou (CN)

(72) Inventor: Qiang Luo, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 221 days.

(21) Appl. No.: 18/565,169

(22) PCT Filed: Sep. 6, 2022

(86) PCT No.: PCT/CN2022/117331
§ 371 (c)(1),
(2) Date: Dec. 1, 2023

(87) PCT Pub. No.: WO2023/065864
PCT Pub. Date: Apr. 27, 2023

(65) Prior Publication Data
US 2024/0284694 A1 Aug. 22, 2024

(30) Foreign Application Priority Data
Oct. 20, 2021 (CN) ........................ 202111222067.6

(51) Int. Cl.
*H10K 50/115* (2023.01)

(52) U.S. Cl.
CPC .................................. *H10K 50/115* (2023.02)

(58) Field of Classification Search
CPC .................................................... H10K 50/115
See application file for complete search history.

(56) References Cited

U.S. PATENT DOCUMENTS 10,985,336 B1 * 4/2021 Hamilton ............. H10K 50/115
2010/0213438 A1 * 8/2010 Cho ..................... H10K 50/156 438/47

(Continued)

FOREIGN PATENT DOCUMENTS

CN 107615884 A 1/2018
CN 111384270 A 7/2020

(Continued)

OTHER PUBLICATIONS

International Search Report in International application No. PCT/CN2022/117331, mailed on Oct. 24, 2022.

(Continued)

*Primary Examiner* — Afroza Chowdhury
(74) *Attorney, Agent, or Firm* — Nathan & Associates; Menachem Nathan

(57) ABSTRACT

The present disclosure discloses a preparation method for a QLED device, a display substrate, and a display apparatus. In the QLED device of the present disclosure, reductive gas is continuously introduced during a quantum dot light-emitting layer forming stage so as to react with oxygen in the environment, to prevent an interface reaction between the quantum dot light-emitting layer and the oxygen in the environment from occurring during the forming process of the quantum dot light-emitting layer, further improving light-emitting efficiency or service life of the device, and advancing the goal of use of quantum dot electroluminescent technology in the display industry.

19 Claims, 5 Drawing Sheets

(56) References Cited

U.S. PATENT DOCUMENTS

| | | | | |
|---|---|---|---|---|
| 2019/0273214 | A1* | 9/2019 | Li | H10K 50/115 |
| 2020/0161383 | A1* | 5/2020 | Kim | H10K 50/171 |
| 2020/0313089 | A1* | 10/2020 | Chen | H10F 71/125 |

FOREIGN PATENT DOCUMENTS

| | | | |
|---|---|---|---|
| CN | 113066950 | A | 7/2021 |
| CN | 113161496 | A | 7/2021 |

OTHER PUBLICATIONS

Written Opinion of the International Search Authority in International application No. PCT/CN2022/117331, mailed on Oct. 24, 2022.

* cited by examiner

PREPARATION METHOD FOR QLED DEVICE, DISPLAY SUBSTRATE, AND DISPLAY APPARATUS

This disclosure claims priority of the Chinese patent disclosure with the Chinese Patent Disclosure No. 202111222067.6, filed in the China National Intellectual Property Administration on Oct. 20, 2021, and entitled “PREPARATION METHOD FOR QLED DEVICE, DISPLAY SUBSTRATE, AND DISPLAY APPARATUS”, which is incorporated herein by reference in its entirety.

TECHNICAL FIELD

The present disclosure relates to the field of display technologies, and more particularly, to a preparation method for QLED device, a display substrate, and a display apparatus.

BACKGROUND

QLED device is a multi-functional layer composite structure composed of an anode, a quantum dot light-emitting layer, an electron transport layer, and a cathode, when stimulated by electricity or light, electrons and holes are injected from their respective electrodes respectively, and combined to emit light on the quantum dot light-emitting layer. The quantum dot light emitting diode (Quantum Dot Light Emitting Diode, QLED) has advantages such as adjustable emission wavelength, narrow emission bandwidth, high light-emitting efficiency, and low cost, and so on, it has attracted more and more attention.

However, under the irradiation of blue light (450 nm), an interface reaction will occur between $O_2$ and the quantum dot light-emitting layer to form sulfate, hydroxide, and oxide, thereby reducing the light-emitting efficiency or service life of the device.

TECHNICAL PROBLEMS

Therefore, there is a need of providing a QLED device that may reduce the adverse effects of oxygen on the quantum dot light-emitting layer effectively, and improve the light-emitting efficiency and the service life of the QLED device.

TECHNICAL SOLUTIONS

Therefore, the present disclosure provides a preparation method for QLED device, a display substrate, and a display apparatus.

Embodiments of the present disclosure provide a preparation method for QLED device, including the steps: providing a substrate; forming a first electrode layer on the substrate; forming a quantum dot light-emitting layer on the first electrode layer in a reducing gas atmosphere; forming an electronic functional layer on the quantum dot light-emitting layer; and forming a second electrode layer on the electronic functional layer.

Alternatively, in some embodiments of the present disclosure, the reductive gas is selected from one or more of CO, NO, $H_2$, $H_2S$, ethylene, and acetylene.

Alternatively, in some embodiments of the present disclosure, in the step of forming the quantum dot light-emitting layer, a reductive gas catalyst is used to accelerate the step, the reductive gas catalyst is selected from one or more of Cu, Pt, and Au.

Alternatively, in some embodiments of the present disclosure, forming an electronic functional layer on a quantum dot light-emitting layer includes: forming an electronic functional layer on the quantum dot light-emitting layer under ultraviolet light irradiation.

Alternatively, in some embodiments of the present disclosure, before the step of forming a quantum dot light-emitting layer on the first electrode layer in an reducing gas atmosphere, the method further includes: forming a hole functional layer on the first electrode layer, and the hole functional layer is disposed between the first electrode layer and the quantum dot light-emitting layer. Alternatively, in some embodiments of the present disclosure, the step of forming a hole functional layer on the first electrode layer includes: forming a hole injection layer or a hole transport layer on the first electrode layer.

Alternatively, in some embodiments of the present disclosure, the step of forming a hole functional layer on the first electrode layer includes: forming a hole injection layer and a hole transport layer on the first electrode layer sequentially.

Alternatively, in some embodiments of the present disclosure, a material of the hole injection layer includes one or more of PEDOT:PSS (Poly(3,4-ethylenedioxythiophene): poly(styrene sulfonate)), MCC, CuPc (Copper phthalocyanin), F4-TCNQ (Tetracyanoquinodimethane-1,3-dimethylisoindolinone), HATCN (Hexacyanobenzenehexaazatriphenylene), a transition metal oxide, and a transition metal chalcogenide.

Alternatively, in some embodiments of the present disclosure, a material of the hole transport layer includes one or more of PVK (Polyvinylcarbazole), Poly-TPD (Poly(9,9-dioctylfluorene-co-bis-N,N'-(4-butylphenyl)-bis-N,N'-phenyl-1,3,4-oxadiaz ole)), CBP (4,4'-Bis(carbazol-9-yl)biphenyl), TCTA(4,4',4"-Tris(carbazol-9-yl)triphenylamine), and TFB (2,2',7,7'-Tetrakis(N,N-di-pmethoxyphenylamine)-9,9'-spirobifluorene).

Alternatively, in some embodiments of the present disclosure, a material of the first electrode layer is selected from one or more of indium tin oxide, fluorine doped tin oxide, indium zinc oxide, graphene, and carbon nanotubes.

Alternatively, in some embodiments of the present disclosure, a material of the second electrode layer is selected from one or more of Al and Ag.

Alternatively, in some embodiments of the present disclosure, the first electrode layer is an anode layer, and the second electrode layer is a cathode layer.

Alternatively, in some embodiments of the present disclosure, the electronic functional layer includes an electron transport layer, and a material of the electron transport layer includes a metal oxide.

Alternatively, in some embodiments of the present disclosure, the metal oxide is selected from one or more of ZnO, $SnO_2$, ITO, $Fe_2O_3$, $CrO_3$, $TiO_2$, $WO_3$, CdO, CuO, and $MoO_2$.

Alternatively, in some embodiments of the present disclosure, a material of the quantum dot light-emitting layer is selected from one or more of CdS, CdSe, CdTe, CdZnS, CdZnSe, CdSeS, ZnO, ZnS, ZnSe, ZnTe, ZnCdSe, GaAs, GaP, GaSb, HgS, HgSe, HgTe, InAs, InP, InSb, AlAs, AlP, CuInS, and CuInSe.

Alternatively, in some embodiments of the present disclosure, from the step of forming the quantum dot light-emitting layer to the step of forming the second electrode layer, the whole processes are in a reducing gas atmosphere.

Alternatively, in some embodiments of the present disclosure, after forming a second electrode layer on the electronic functional layer, the method further includes: encapsulating.

Alternatively, in some embodiments of the present disclosure, from the step of forming the quantum dot light-emitting layer to the step of encapsulating, the whole processes are in a reducing gas atmosphere.

Correspondingly, the embodiments of the present disclosure further provide a display substrate including a QLED device manufactured by the preparation method for the QLED device above.

Correspondingly, embodiments of the present disclosure further provide a display apparatus including the display substrate above.

ADVANTAGEOUS EFFECTS

According to the QLED device of the present disclosure, the reductive gas is continuously introduced during the forming of the quantum dot light-emitting layer to react with oxygen in the environment, thereby avoiding an interface reaction between the quantum dot light-emitting layer and the oxygen in the environment during the forming process of the quantum dot light-emitting layer, and further improving light-emitting efficiency or service life of the device. According to the QLED device prepared by the present disclosure, the device performance of the QLED device meet the commercial disclosure standard, thus advancing the goal of applying quantum dot electroluminescent technology to the display industry.

BRIEF DESCRIPTION OF FIGURES

In order to more clearly explain the technical solutions in the embodiments of the present disclosure, the figures to be used in the description of the embodiments are briefly described below. It is apparent that the figures in the following description are merely some embodiments of the present disclosure. For those skilled in the art, without involving any creative effort, other figures may be obtained based on these figures.

DESCRIPTION OF REFERENCE NUMBERS

Figure 1:
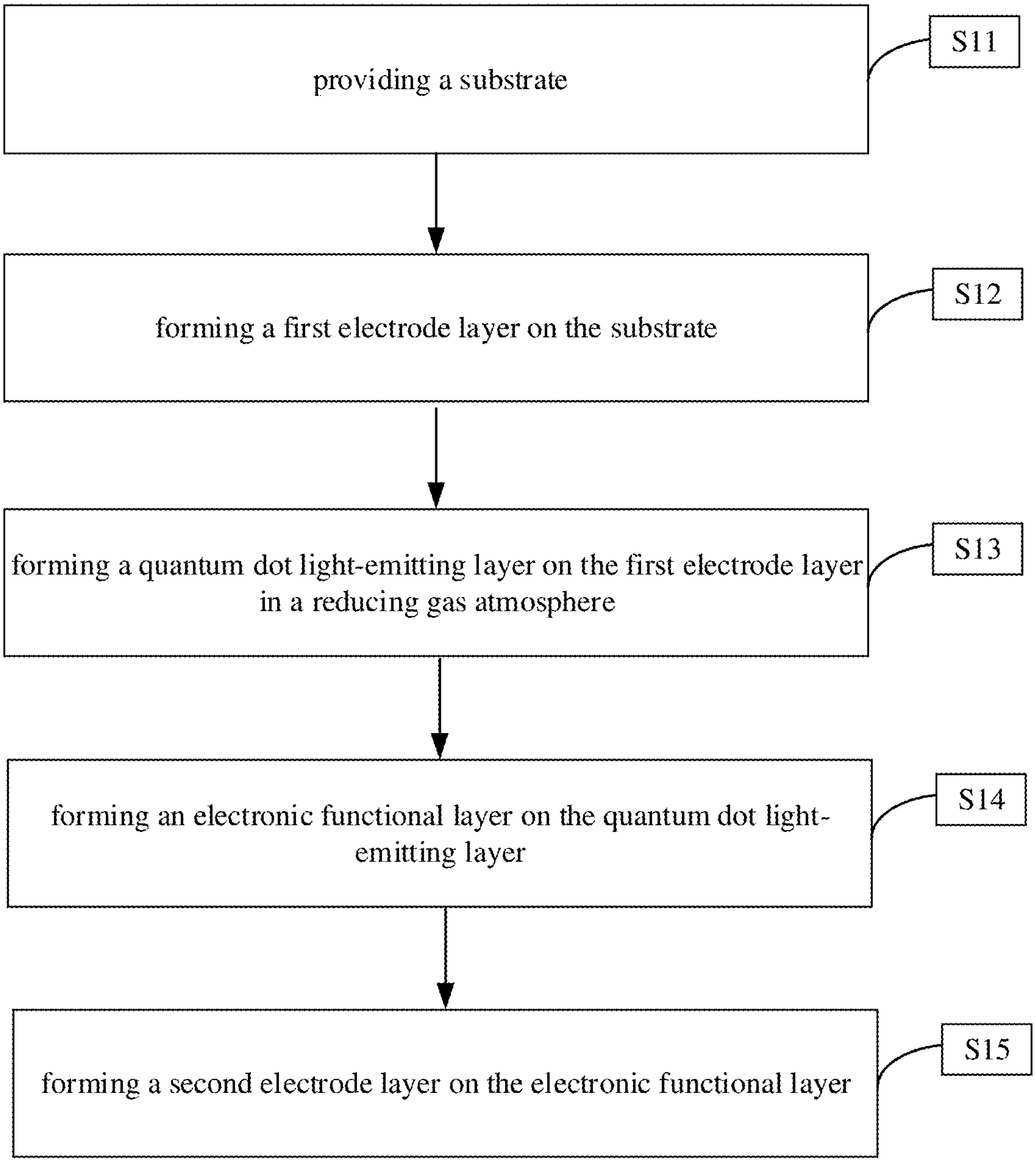
FIG. 1 is a flowchart showing steps of a preparation method for QLED device according to an embodiment of the present disclosure.

100, QLED device;
101, substrate;
110 anode layer;
120, hole injection layer;
130, hole transport layer;
140, quantum dot light-emitting layer;
150, electron transport layer; and
160, cathode layer.

EMBODIMENTS OF THE PRESENT DISCLOSURE

Technical solutions in embodiments of the present disclosure will be clearly and completely described below with reference to the figures in the embodiments of the present disclosure. It is apparent that, the described embodiments are only a part of embodiments of the present disclosure, rather than all the embodiments. Based on the embodiments in the present disclosure, all other embodiments obtained by those skilled in the art without creative effort fall within the protection scope of the present disclosure.

The embodiments of the present disclosure provide a preparation method for QLED device and a QLED device therefrom. Detailed description is given below. It should be noted that the order in which the following embodiments are described is not intended to limit the preferred order of the embodiments. Additionally, in the description of the present disclosure, the term "comprising/including" means "comprising/including but not limited to." Various embodiments of the present disclosure may be presented in a form of range. It should be understood that the description in the form of range is merely for convenience and brevity, and should not be construed as a hard limitation on the scope of the disclosure. Therefore, it should be considered that the recited range description has specifically disclosed all possible subranges, as well as a single numerical value within that range. For Embodiment, it should be considered that a description of a range from 1 to 6 has specifically disclosed su-branges, such as from 1 to 3, from 1 to 4, from 1 to 5, from 2 to 4, from 2 to 6, from 3 to 6, etc., and a single number within the range, such as 1, 2, 3, 4, 5, and 6, regardless of the range. Whenever a range of values is indicated herein, it is meant to include any recited number (fraction or integer) within the indicated range.

In the present disclosure, the term "and/or" is used to describe the association relationship of associated objects, and means that there may be three relationships, for example, "A and/or B" may refer to three relationships: for example, A exists alone, A and B exist at the same time, and B exists alone, where A and B may be singular or plural.

In the present disclosure, the terms "at least one" or "one or more" refer to one or more, and "a plurality of/multiple" refers to two or more. The terms "at least one", "at least one of the followings", or the like, refer to any combination of the items listed, including any combination of a single item or a plurality of items. For example, "at least one of a, b, or c" or "at least one of a, b, and c" may refer to: a, b, c, a-b (i.e., a and b), a-c, b-c, or a-b-c, where a, b, and c may be single or plural (multiple).

The inventor found in the experiment that: with the increase of the oxygen content in the environment, a light-emitting efficiency and a service life of the device will decrease gradually, thereby leads to the decrease of the light-emitting efficiency and the service life of the device.

In the step of research and practice of the prior art, the inventor of the present disclosure further found that, during the manufacturing process of the top emitting device, a reductive gas catalyst is introduced into the quantum dot light-emitting layer (QD layer), so that the problems of low light-emitting efficiency and poor service life caused by the interface reaction between the quantum dot light-emitting layer and $O_2$. An embodiment of the present disclosure provides a preparation method for QLED device, referring to FIG. 1, including following steps:

Step S11: providing a substrate;

Step S12: forming a first electrode layer on the substrate;

Step S13: forming a quantum dot light-emitting layer on the first electrode layer in a reducing gas atmosphere;

Step S14: forming an electronic functional layer on the quantum dot light-emitting layer; and Step S15: forming a second electrode layer on the electronic functional layer.

In one embodiment, the reductive gas is selected from one or more of CO, NO, $H_2$, $H_2S$, ethylene, and acetylene. In an embodiment, in the step of forming a quantum dot light-emitting layer, the process is accelerated by using a reductive gas catalyst, the reductive gas catalyst is selected from one or more of Cu, Pt, and Au.

In an experiment, the inventor further found that: the higher resistance of the electronic functional layer (ETL layer) is not conducive to electron transport, which leads to the balance of hole-electron injection, and eventually leads to the decrease of the light-emitting efficiency and the service life of the device.

In the process of research and practice of the prior art, the inventor of the present disclosure further found that, during the manufacturing process of a top emitting device, the ultraviolet (UV) light is used to irradiate a metal oxide layer can improve a weak electron transport performance of the electron transport layer (ETL layer) due to the high resistance.

In one embodiment, the step of forming an electronic functional layer on a quantum dot light-emitting layer includes: forming an electronic functional layer on a quantum dot light-emitting layer under a ultraviolet irradiation.

In one embodiment, before the step of forming a quantum dot light-emitting layer on the first electrode layer in a reducing gas atmosphere, the method further includes: forming a hole functional layer on the first electrode layer, and the hole functional layer is disposed between the first electrode layer and the quantum dot light-emitting layer.

In one embodiment, the step of forming a hole functional layer on the first electrode layer includes:

forming a hole injection layer on the first electrode layer; or forming a hole transport layer on the first electrode layer; or forming a hole injection layer and a hole transport layer on the first electrode layer sequentially.

In one embodiment, a material of the hole injection layer includes one or more of PEDOT:PSS(Poly(3,4-ethylenedioxythiophene):poly(styrene sulfonate)), MCC, CuPc (Copper phthalocyanin), F4-TCNQ (Tetracyano-quinodimethane-1,3-dimethylisoindolinone), HATCN (Hexacyanobenzenehexaazatriphenylene), a transition metal oxide, and a transition metal chalcogenide; and/or a material of the hole transport layer includes one or more of PVK (Polyvinylcarbazole), Poly-TPD (Poly(9,9-dioctylfluorene-co-bis-N,N'-(4-butylphenyl)-bis-N,N'-phenyl-1,3,4-oxadiaz ole)), CBP (4,4'-Bis(carbazol-9-yl)biphenyl), TCTA(4,4',4"-Tris(carbazol-9-yl)triphenylamine), and TFB (2,2',7,7'-Tetrakis(N,N-di-pmethoxyphenylamine)-9,9'-spirobifluorene).

A material of the first electrode layer includes one or more of indium tin oxide, fluorine doped tin oxide, indium zinc oxide, graphene, and carbon nanotubes; and/or a material of the second electrode layer includes one or more of Al and Ag. A material of the electronic functional layer includes metal oxide. Furthermore, the metal oxide is selected from but not limited to one or more of ZnO, $SnO_2$, ITO, $Fe_2O_3$, $CrO_3$, $TiO_2$, $WO_3$, CdO, CuO, and $MoO_2$. For example, in one embodiment, the material of the electron transport layer includes metal oxide, and the material of the electron transport layer is selected from, but not limited to, one or more of ZnO, $SnO_2$, ITO, $Fe_2O_3$, $CrO_3$, $TiO_2$, $WO_3$, CdO, CuO, and $MoO_2$.

In the present disclosure, the reductive gas catalyst is continuously introduced when the quantum dot light-emitting layer is formed, so as to remove oxygen in the environment, to reduce or even cut off the negative influence of the oxygen on the quantum dot light-emitting layer, thus to increase the light-emitting efficiency and the service life of the device. Introducing Ultraviolet (UV) light for irradiation when forming the electronic functional layer can reduce the resistance of the metal oxide, so as to increase the electron transmitting efficiency, to ensure the balance of the hole-electron injection, and finally to increase the light-emitting efficiency and the service life of the device.

In the embodiments of the present disclosure, a quantum dot for the quantum dot light-emitting layer can be an alloy quantum dot or a core-shell quantum dot. Furthermore, a material of the quantum dot light-emitting layer is selected from one or more of CdS, CdSe, CdTe, CdZnS, CdZnSe, CdSeS, ZnO, ZnS, ZnSe, ZnTe, ZnCdSe, GaAs, GaP, GaSb. HgS, HgSe, HgTe, InAs, InP, InSb, AlAs, AlP, CuInS, and CuInSe. The core-shell quantum dot is selected from but not limited to group II-IV compounds (e.g. CdS, CdSe) and group III-V compounds (e.g. InP, InAs).

In the embodiments of the present disclosure, the first electrode layer can be an anode layer, for Embodiment, the material of the first electrode layer is selected from one or more of indium tin oxide (e.g. ITO), fluorine doped tin oxide, indium zinc oxide, graphene, and carbon nanotubes. The second electrode layer is a cathode layer, for Embodiment, the material of the second electrode layer is selected from one or more of Al and Ag.

Figure 2:
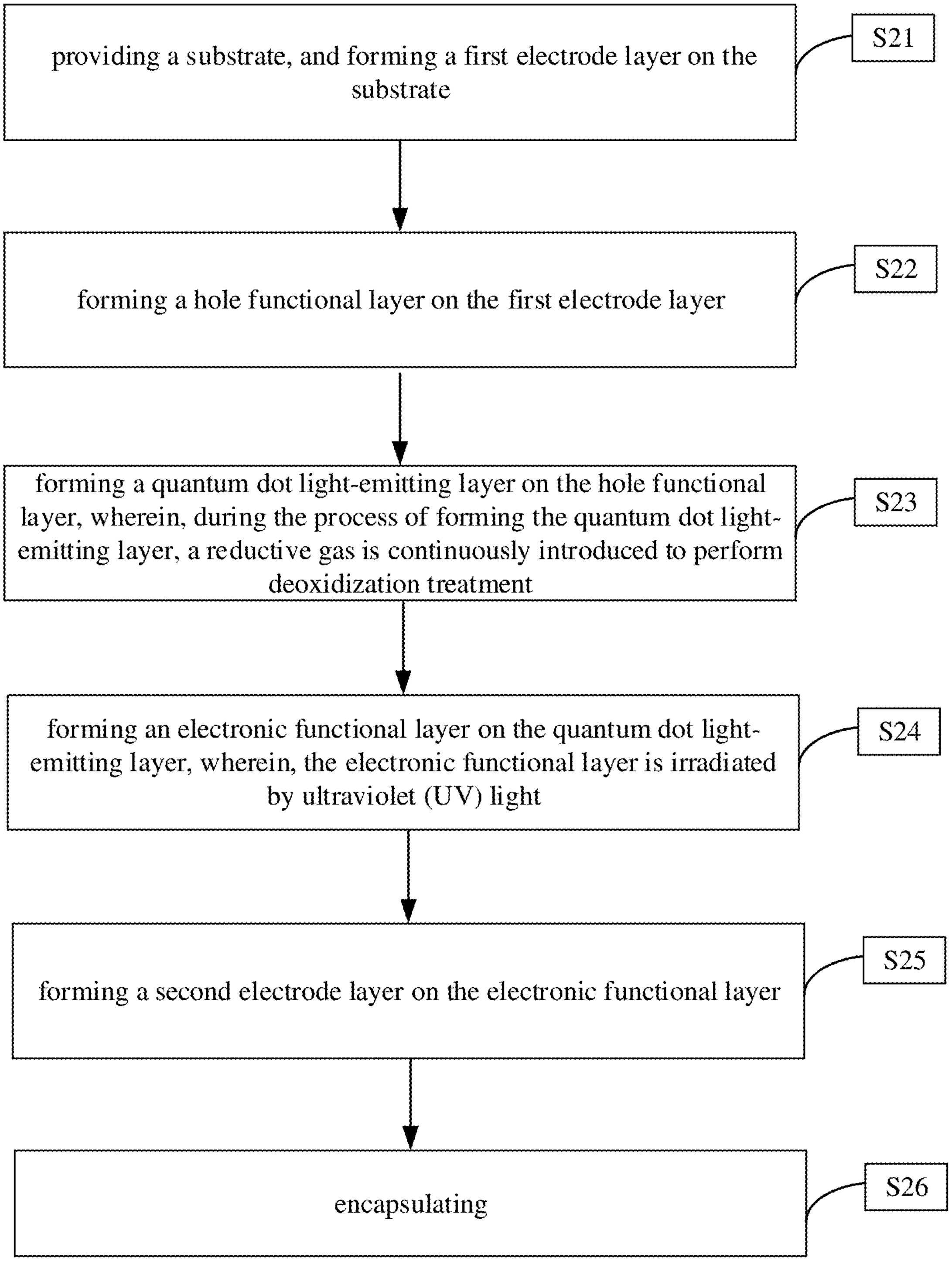
FIG. 2 is flowchart showing steps of a preparation method for QLED device according to another embodiment of the present disclosure.

In one embodiment, referring to FIG. 2, the preparation method for QLED device includes following steps:

Step S21: providing a substrate, and forming a first electrode layer on the substrate;

Step S22: forming a hole functional layer on the first electrode layer;

Step S23: forming a quantum dot light-emitting layer on the hole functional layer, wherein, during the process of forming the quantum dot light-emitting layer, a reductive gas is continuously introduced to perform deoxidization treatment;

Step S24: forming an electronic functional layer on the quantum dot light-emitting layer, wherein, the electronic functional layer is irradiated by ultraviolet (UV) light;

Step S25: forming a second electrode layer on the electronic functional layer; and Step S26: encapsulating.

Figure 3:
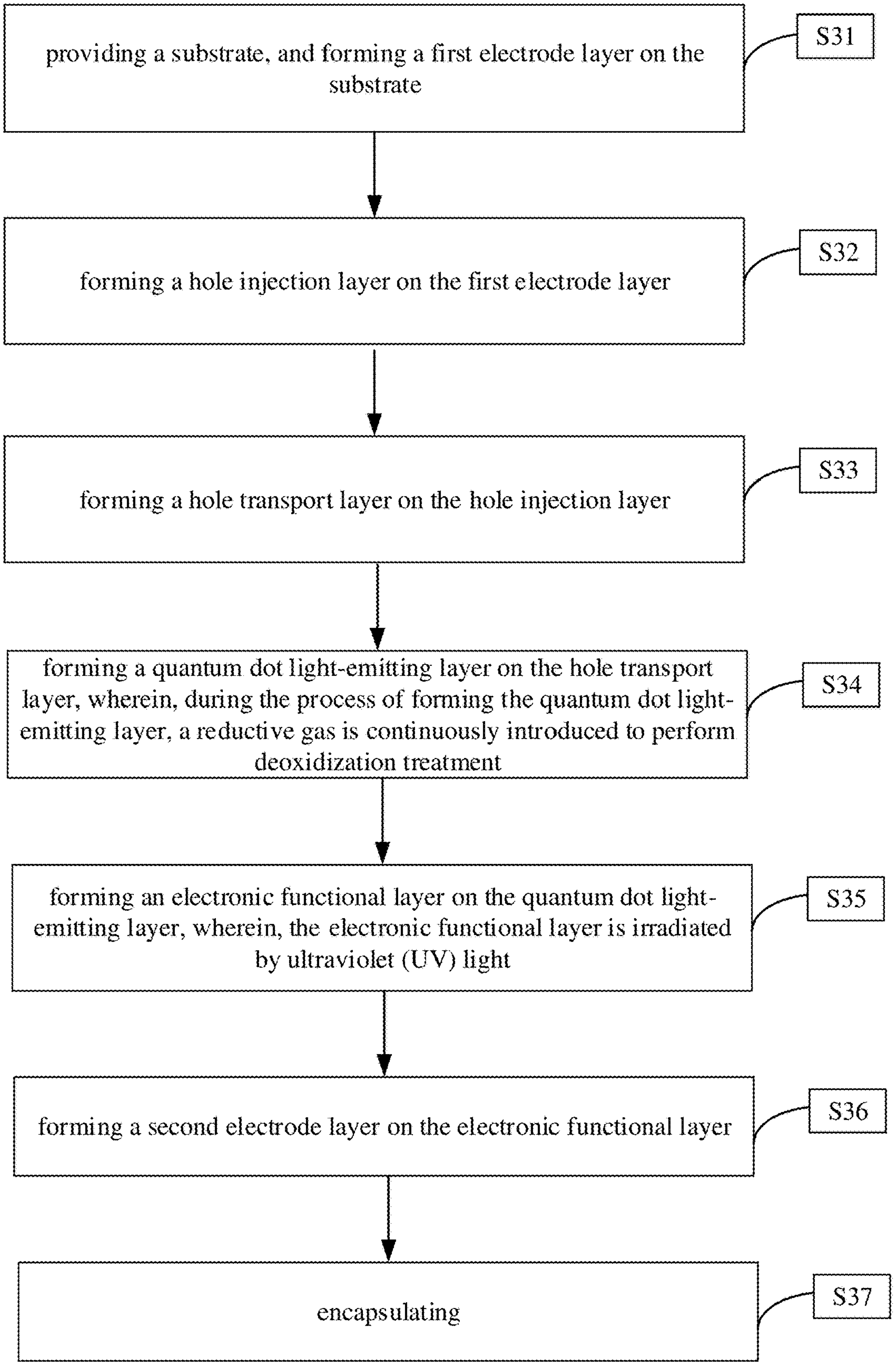
FIG. 3 is flowchart showing steps of a preparation method for QLED device according to still another embodiment of the present disclosure.

In another embodiment, referring to FIG. 3, the preparation method for QLED device includes following steps:

Step S31: providing a substrate, and forming a first electrode layer on the substrate;

Step S32: forming a hole injection layer on the first electrode layer;

Step S33: forming a hole transport layer on the hole injection layer;

Step S34: forming a quantum dot light-emitting layer on the hole transport layer, wherein, during the process of forming the quantum dot light-emitting layer, a reductive gas is continuously introduced to perform deoxidization treatment;

Step S35: forming an electronic functional layer on the quantum dot light-emitting layer, wherein, the electronic functional layer is irradiated by ultraviolet (UV) light; furthermore, a material of the electronic functional layer is selected from one or more of ZnO, $SnO_2$, ITO, $Fe_2O_3$, $CrO_3$, $TiO_2$, $WO_3$, CdO, CuO, and $MoO_2$; and Step S36: forming a second electrode layer on the electronic functional layer;

Step S37: encapsulating, and in the preparation method for QLED device, the reductive gas catalyst is introduced when the quantum dot light-emitting layer is forming, and the introduction of the reductive gas catalyst is cut off until the encapsulating is finished.

It can be seen that, from the step of forming the quantum dot light-emitting layer to the step of forming the second electrode layer, the whole process is performed in a reducing gas atmosphere.

In a preferred embodiment, the preparation method for QLED device includes the following steps:

Firstly, forming an anode layer, a hole injection layer (HIL), and a hole transport layer (HTL) on a substrate sequentially. A material of the anode layer may be conventional in the art, a material of the hole injection layer (HIL) may be conventional in the art, and a material of the hole transport layer (HTL) may be conventional in the art.

Figure 4:
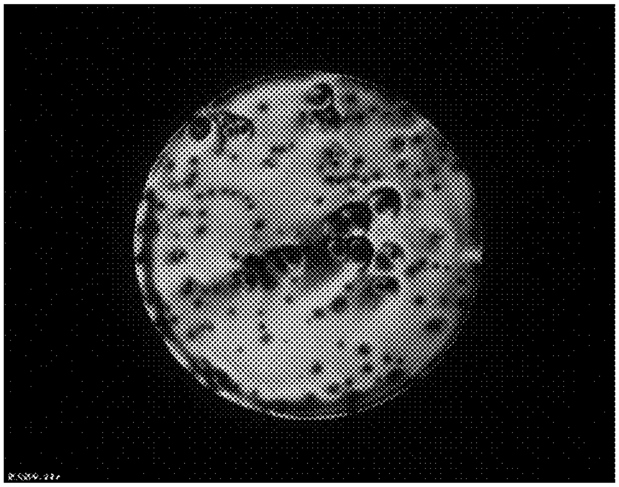
FIG. 4 is a schematic diagram showing that a local area cannot be lighted up due to the accumulation of dust layer on a surface of the quantum dot.
Figure 5:
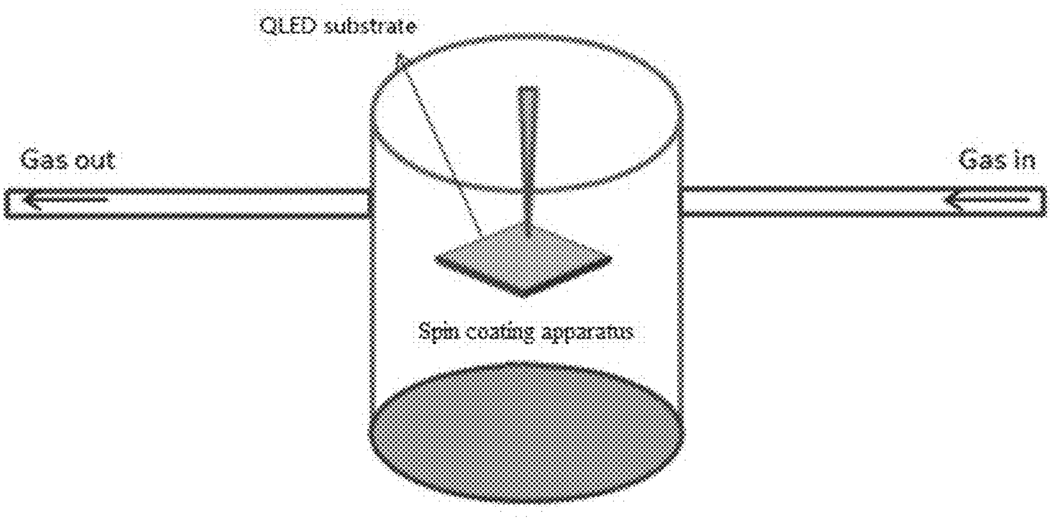
FIG. 5 is a schematic diagram of a gas flow device being arranged inside of a spin coating apparatus according to an embodiment of the present disclosure.

Then, forming a quantum dot light-emitting layer on the hole transport layer. When forming the quantum dot light-emitting layer, the reductive gas catalyst is continuously introduced for oxygen removal treatment. Because under the irradiation of blue light (450 nm), when the QD layer is spin-coated, the QD layer will react with the oxygen in the environment at the interface, to generate sulfate, hydroxide, and oxide, thereby destroying the original structure of the QD layer, and finally decreasing the light-emitting efficiency and the service life of the device. Therefore, in the present disclosure, the reductive gas is continuously introduced during the process of forming the quantum dot light-emitting layer, so that, the oxygen in the environment can be effectively reacted and consumed. It should be noted that, in an actual preparation process, because the volume of the glove box is too large, and a surface dust layer accumulates with the using time. If the reductive gas is introduced into the whole glove box, a large number amount of gas source will be needed and the surface dust layer will be further accumulated on a surface of the quantum dot. Therefore, there will be a lot of dirt on the surface of the quantum dot, the quantum dot will eventually not be lighted up, and the light-emitting efficiency may be 0. As is shown in FIG. 4, the area where the surface of the quantum dot can not be lightened is shown in FIG. 4, that is the light-emitting efficiency is 0. Therefore, the reductive gas can be introduced to a surface area of the QLED device only, that is, an area where a film layer is formed. For example, a gas flow device can be installed inside of a spin coating apparatus, and the reductive gas can be flowed in the spin coating apparatus only, as shown in the FIG. 5. Furthermore, while introducing the reductive gas, a reductive gas catalyst, for example a noble metal such as Pt, Au and Cu, can be used in the environment, so as to enhance the sample preparation effect of the reductive gas. Specifically, the reductive gas catalyst can be used at the inlet of the reductive gas.

Figure 6:
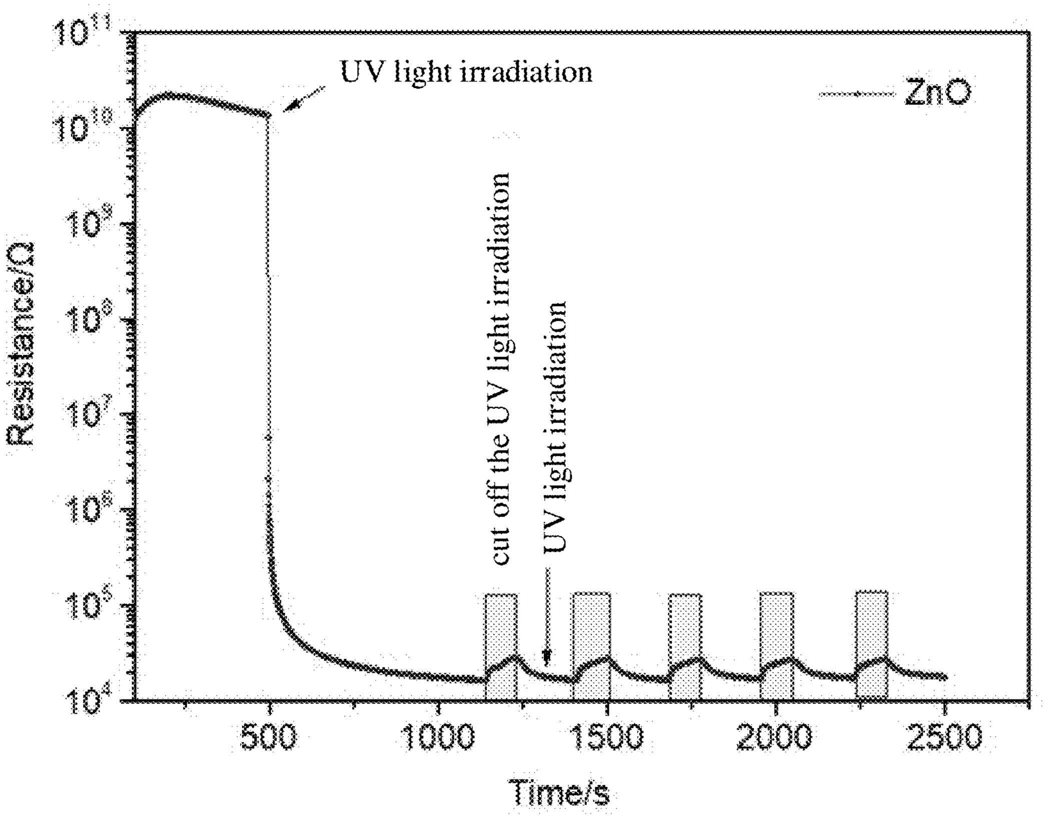
FIG. 6 is a graph showing resistance variation of the electron transport layer under ultraviolet light irradiation according to an embodiment of the present disclosure.

Then, forming an electron transport layer (ETL) is prepared on the quantum dot light-emitting layer continuously. In the step of forming the electron transport layer, ultraviolet (UV) light irradiation is continuously used throughout the whole process, because the material of the ETL is generally a metal oxide semiconductor material, has an extremely strong absorption rate for ultraviolet light, and can change after absorbing the ultraviolet light. The UV irradiation can also promote bound electrons in the valence band to be excited by light energy to jump to the conduction band, forming free moving electrons, that is, the number of carriers in the conduction band increases, the conductivity of the material increases, the resistivity of the material decreases, and the resistance value does not increase again with the disappearance of the light irradiation. Most of the increase, if any, is caused due to the oxygen being absorbed again, so it is necessary to disconnect the light irradiation after the device is encapsulated, as shown in FIG. 6. On the contrary, when there is no ultraviolet irradiation, oxygen is adsorbed on the surface of the material, and oxygen captures electrons on the surface of the material, so that an electron depletion layer is formed on the surface of the material, which leads to the increase of grain boundary barrier, the difficulty of electrons passing through, the decrease of carrier mobility, and the increase of the resistance. At this time, by means of ultraviolet irradiation, the adsorbed oxygen is promoted to be desorbed, the grain boundary barrier is reduced decreases, the carrier mobility is increased, and the resistance of the material is decreased.

Finally, forming the cathode layer on the electron transport layer, and then encapsulating.

In the preparation method for QLED device above, the reductive gas is closed after the encapsulating is finished. The reductive gas can be CO, NO, $H_2$, $H_2S$, ethylene, acetylene, and mixed gas thereof. The material of the electron transport layer (ETL) may be ZnO, $SnO_2$, ITO (Indium tin oxide), $Fe_2O_3$, $CrO_3$, $TiO_2$, $WO_3$, CdO, CuO, $MoO_2$ and other semiconductor materials.

An embodiment of the present disclosure further provides a QLED device, which is manufactured by the above preparation method for QLED device.

Figure 7:
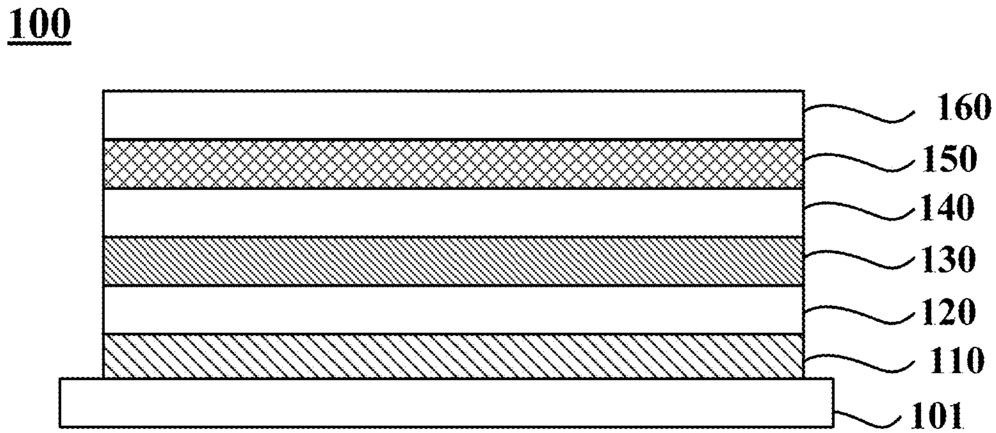
FIG. 7 is a structure diagram of a QLED device according to an embodiment of the present disclosure.

In an embodiment, referring to FIG. 7, the QLED device 100 includes an anode layer 110, a hole injection layer 120, a hole transport layer 130, a quantum dot light-emitting layer 140, an electron transport layer 150, and a cathode layer 160 sequentially stacked on a substrate 101. Specifically, the anode layer 110 is disposed on one side of the substrate 101; the hole injection layer 120 is disposed on a side of the anode layer 110 away from the substrate 101; the hole transport layer 130 is disposed on a side of the hole injection layer 120 away from the anode layer 110; the quantum dot light-emitting layer 140 is disposed on a side of the hole transport layer 130 away from the hole injection layer 120; the electron transport layer 150 is disposed on a side of the quantum dot light-emitting layer 140 away from the hole transport layer 130; and the cathode layer 160 is disposed on a side of the electron transport layer 150 away from the quantum dot light-emitting layer 140. Furthermore, the QLED device further includes an encapsulation layer disposed on a side of the cathode layer 160 away from the electron transport layer 150.

The present disclosure further provides a display substrate including the QLED device manufactured above.

The present disclosure further provides a display apparatus including the display substrate described above.

The present disclosure has been subjected to a plurality of experiments successively, now a part of the experimental results is taken as a reference for further detailed description of the invention, and the present disclosure will be described in detail below with reference to specific embodiments.

The following embodiments are carried out with top-emitting quantum dot devices as experimental subjects.

Example 1

This example provides a preparation method for QLED device, including following steps:

forming an anode layer, a hole injection layer (HIL), and a hole transport layer (HTL) on a substrate sequentially;

forming a quantum dot light-emitting layer on the hole transport layer, and when the quantum dot light-emitting layer is prepared, the reductive gas is continuously introduced to perform deoxidization treatment. Because under the irradiation of blue light (450 nm), when spin-coating the QD layer, the QD layer interface reacts with oxygen in the environment to form sulfate, hydroxide, and oxide, which destroys the original structure of the QD layer, and finally decreases the light-emitting efficiency and the service life of the device. Therefore, the reductive gas continuously introduced in the spin-coating step to effectively react with oxygen in the environment; for example, installing a gas flow control device on a spin coating apparatus, enabling the circulation of the reducing gas only within the spin coating apparatus; the reductive gas catalyst is used to enhance the sample preparation effect of the reductive gas, the reductive gas catalyst can be a noble metals such as Pt, Au, and Cu;

forming an electron transport layer (ETL) on the substrate, and in the step of forming the electron transport layer, ultraviolet light (UV irradiation) is continuously used throughout the whole process; because the material of the ETL is generally a metal oxide semiconductor material, has an extremely strong absorption rate for the ultraviolet light, and changes in two ways after absorbing ultraviolet light: 1, when there is no ultraviolet irradiation, oxygen is adsorbed on the surface of the material, and captures electrons on the surface of the material to form an electron depletion layer on the surface of the material, which leads to the increase of grain boundary barrier, the difficulty of electrons passing through, the decrease of carrier mobility, and the increase of resistance; at this time, by means of ultraviolet irradiation, the adsorbed oxygen is desorbed, the grain boundary barrier decreases, the carrier mobility increases, and the resistance of the material decreases; 2, the UV irradiation also promotes bound electrons in the valence band to be excited by light energy to jump to the conduction band, forming free-moving electrons, that is, the number of carriers in the conduction band increases, the conductivity of the material increases, and the resistivity of the material decreases, the resistance value does not increase again with the disappearance of the light irradiation, and a part of the increasing, if present, is caused by the re-adsorption of oxygen being absorbed again, so it is necessary to stop UV irradiation after the device is encapsulated, as shown in FIG. 6;

forming a cathode on the electron transport layer, and then encapsulating. The introduction of the reductive gas is turned off after the encapsulating is finished. The reductive gas can be CO, NO, $H_2$, $H_2S$, ethylene, acetylene, and mixtures thereof. The material of the electron transport layer (ETL) can be semiconductor materials such as ZnO, $SnO_2$, ITO (Indium tin oxide), $Fe_2O_3$, $CrO_3$, $TiO_2$, $WO_3$, CdO, CuO, and $MoO_2$.

Example 2

This example provides a QLED device manufactured by the preparation method for QLED device of Example 1, except for, using reductive gas CO for the deoxidization treatment. Referring to FIG. 7, the QLED device 100 includes an anode layer 110, a hole injection layer 120, a hole transport layer 130, a quantum dot light-emitting layer 140, an electron transport layer 150, and a cathode layer 160 sequentially stacked on a substrate 101. Specifically, a structure of the QLED device is: ITO/MCC/TFB/QDs (using CO as the reductive gas)/ZnO (UV)/Ag, wherein, electrode is prepared by an evaporation method, and MCC, TFB, QDs, and ZnO are prepared by coating.

Example 3

This example provides a QLED device manufactured by the preparation method for QLED device of Example 1, except for, using reductive gas $H_2$ for the deoxidization treatment. Referring to FIG. 7, the QLED device 100 includes an anode layer 110, a hole injection layer 120, a hole transport layer 130, a quantum dot light-emitting layer 140, an electron transport layer 150, and a cathode layer 160 sequentially stacked on a substrate 101. Specifically, a structure of the QLED device is: ITO/MCC/TFB/QDs (using reductive gas $H_2$)/ZnO (UV)/Ag, wherein, electrode is prepared by an evaporation method, and MCC, TFB, QDs, and ZnO are prepared by coating.

Example 4

This example provides a QLED device manufactured by the preparation method for QLED device of Example 1, except for, using ethylene as the reductive gas for the deoxidization treatment. Referring to FIG. 7, the QLED device 100 includes an anode layer 110, a hole injection layer 120, a hole transport layer 130, a quantum dot light-emitting layer 140, an electron transport layer 150, and a cathode layer 160 sequentially stacked on a substrate 101. Specifically, a structure of the QLED device is: ITO/MCC/TFB/QDs (using ethylene as the reductive gas)/ZnO (UV)/Ag, wherein, electrode is prepared by an evaporation method, and MCC, TFB, QDs, and ZnO are prepared by coating.

Comparative Example 1

The Comparative Example 1 provides a QLED device that has neither reductive gas catalyst nor ultraviolet irradiation treatment. The QLED device includes an anode layer, a hole injection layer, a hole transport layer, a quantum dot light-emitting layer, an electron transport layer, and a cathode layer sequentially stacked on a substrate. Specifically, a structure of the QLED device is: ITO/MCC/TFB/QDs/ZnO/Ag, wherein, electrode is prepared by an evaporation method, and MCC, TFB, QDs, and ZnO are prepared by coating.

Comparative Example 2

The Comparative Example 2 provides a QLED device, compared with Example 1, a method for manufacturing the QLED device of Comparative Example 2 has no reductive gas but has ultraviolet irradiation treatment. The QLED device includes an anode layer, a hole injection layer, a hole transport layer, a quantum dot light-emitting layer, an electron transport layer, and a cathode layer sequentially stacked on a substrate. Specifically, a structure of the QLED device is: ITO/MCC/TFB/QDs/ZnO (UV)/Ag, wherein, electrode is prepared by an evaporation method, and MCC, TFB, QDs, and ZnO are prepared by coating.

Comparative Example 3

The Comparative Example 3 provides a QLED device which is prepared by a preparation method for the QLED device according to Example 1, in which an reductive gas catalyst is used but there is no ultraviolet irradiation treatment. The QLED device includes an anode layer, a hole injection layer, a hole transport layer, a quantum dot light-emitting layer, an electron transport layer, and a cathode layer sequentially stacked on a substrate. Specifically, a structure of the QLED device is: ITO/MCC/TFB/QDs (using CO as the reductive gas)/ZnO/Ag, in which the electrode is prepared by an evaporation method, and MCC, TFB, QDs, and ZnO are prepared by coating.

Test Example 1 Quantum Dot Light Emitting Diode Related Photoelectric Performance Test CE@max, CE@1 knit, and T95@1 knit of QLED devices prepared in Example 2, Example 3, Example 4, Comparative Example 1, Comparative Example 2, and Comparative Example 3 were investigated at a current of 2 mA, respectively, and results are shown in Table 1, respectively.

TABLE 1

| | Example 2 | Example 3 | Example 4 | Comparative Example 1 | Comparative Example 2 | Comparative Example 3 |
|---|---|---|---|---|---|---|
| CE@max (cd/A) | 125.2 | 152.6 | 140.8 | 49.5 | 83.6 | 76.9 |
| CE@1knit (cd/A) | 63.3 | 96.7 | 75.8 | 26.5 | 45.7 | 43.3 |
| T95@1knit (hrs) | 13200 | 22000 | 14000 | 800 | 8000 | 5500 |

It can be seen from Table 1 that the service life T95 @ 1 Knit of the device and the luminous efficiency Ce @ 1 Knit under low brightness can be increased by introducing the reducing gas catalyst and the ultraviolet irradiation treatment respectively, and when the reductive gas catalyst and the ultraviolet irradiation treatment are introduced at the same time, the luminous efficiency under the service life and low brightness of the device is further increased, and the effect of the $H_2$ reductive gas catalyst in different types of gases is optimal; it is indicated that the reductive gas catalyst and the ultraviolet irradiation process can weaken or even isolate the interface reaction between $O_2$ and the QD layer in the spin-coating environment and reduce the resistance of the ETL layer, thereby achieving the purpose of increasing the luminous efficiency and service life of the device.

The present application provides a method for optimizing a QLED device, in which mainly for the QD layer and the TEL layer, a reductive gas is used to conduct deoxidation treatment under the presence of a catalyst in a QD layer spin coating stage; and ultraviolet (UV) irradiation is continuously performed in the ETL layer spin coating stage. The QLED device obtained in the present application can reduce the adverse effect of oxygen on the QD layer and the disadvantage of high resistance and low electron transport efficiency of the ETL layer.

In the above-mentioned embodiments, the description of each embodiment has its own emphasis, and some of the embodiments that are not described in detail in certain embodiments may refer to the related description of other embodiments.

The preparation method for QLED device, the display substrate, and the display apparatus according to embodiments of the present disclosure are described in detail above. The principles and embodiments of the present disclosure have been described with reference to specific embodiments, and the description of the above embodiments is merely intended to aid in the understanding of the method of the present disclosure and its core idea. At the same time, changes may be made by those skilled in the art to both the specific implementations and the scope of disclosure in accordance with the teachings of the present disclosure. In view of the foregoing, the content of the present specification should not be construed as limiting the disclosure.

What is claimed is:

1. A preparation method for QLED device, comprising the following steps:
- providing a substrate;
- forming a first electrode layer on the substrate;
- forming a quantum dot light-emitting layer on the first electrode layer in a reducing gas atmosphere, and a reductive gas of the reducing gas atmosphere is selected from one or more of CO, NO, $H_2$, $H_2S$, ethylene, and acetylene; wherein during the process of forming a quantum dot light-emitting layer, the reductive gas of the reducing gas atmosphere is continuously introduced to remove oxygen in the environment;
- forming an electronic functional layer on the quantum dot light-emitting layer; and
- forming a second electrode layer on the electronic functional layer.

2. The method according to claim 1, wherein in the step of forming the quantum dot light-emitting layer, a reductive gas catalyst is used to accelerate the step, wherein the reductive gas catalyst is selected from one or more of Cu, Pt, and Au.

3. The method according to claim 1, wherein the step of forming an electronic functional layer on a quantum dot light-emitting layer comprises: forming an electronic functional layer on the quantum dot light-emitting layer under an ultraviolet light irradiation.

4. The method according to claim 1, wherein before the step of forming a quantum dot light-emitting layer on the first electrode layer in a reducing gas atmosphere, the method further comprises: forming a hole functional layer on the first electrode layer, and the hole functional layer is disposed between the first electrode layer and the quantum dot light-emitting layer.

5. The method according to claim 4, wherein the step of forming a hole functional layer on the first electrode layer comprises: forming a hole injection layer or a hole transport layer on the first electrode layer.

6. The method according to claim 4, wherein the step of forming a hole functional layer on the first electrode layer comprises: forming a hole injection layer and a hole transport layer on the first electrode layer sequentially.

7. The method according to claim 6, wherein a material of the hole injection layer comprises one or more of PEDOT:PSS, MCC, CuPc, F4-TCNQ, HATCN, a transition metal oxide, and a transition metal chalcogenide.

8. The method according to claim 6, wherein a material of the hole transport layer comprises one or more of PVK, Poly-TPD, CBP, TCTA, and TFB.

9. The method according to claim 1, wherein a material of the first electrode layer is selected from one or more of indium tin oxide, fluorine doped tin oxide, indium zinc oxide, graphene, and carbon nanotubes.

10. The method according to claim 1, wherein a material of the second electrode layer is selected from one or more of Al and Ag.

11. The method according to claim 1, wherein the first electrode layer is an anode layer, and the second electrode layer is a cathode layer.

12. The method according to claim 1, wherein the electronic functional layer comprises an electron transport layer, and a material of the electron transport layer comprises metal oxide; and in the step of forming an electronic functional layer on the quantum dot light-emitting layer, ultraviolet light irradiation is continuously used throughout the whole process.

13. The method according to claim 12, wherein the metal oxide is selected from one or more of ZnO, SnO2, ITO, Fe2O3, CrO3, TiO2, WO3, CdO, CuO, and MoO2.

14. The method according to claim 1, wherein a material of the quantum dot light-emitting layer is selected from one or more of CdS, CdSe, CdTe, CdZnS, CdZnSe, CdSeS, ZnO, ZnS, ZnSe, ZnTe, ZnCdSe, GaAs, GaP, GaSb, HgS, HgSe, HgTe, InAs, InP, InSb, AlAs, AlP, CuInS, and CuInSe.

15. The method according to claim 1, wherein from the step of forming the quantum dot light-emitting layer to the step of forming the second electrode layer, the whole process is in a reducing gas atmosphere.

16. The method according to claim 1, wherein after the step of forming a second electrode layer on the electronic functional layer, the method further includes:

encapsulating.

17. The method according to claim 1, wherein from the step of forming the quantum dot light-emitting layer to the step of encapsulating, the whole process is in a reducing gas atmosphere.

18. A display substrate, comprising a QLED device prepared by the preparation method for QLED device according to claim 1.

19. A display apparatus comprising a display substrate according to claim 18.

* * * * *